(12) United States Patent
Ewing et al.

(10) Patent No.: US 10,993,550 B2
(45) Date of Patent: May 4, 2021

(54) ANTI-THEFT RETAIL MERCHANDISE PUSHER WITH REMOTE ALARM FEATURE

(71) Applicants: Brent O. Ewing, Aurora, OH (US);
Chan Chor Man, Tai Po (HK);
Thomas O. Nagel, Rockford, IL (US)

(72) Inventors: Brent O. Ewing, Aurora, OH (US);
Chan Chor Man, Tai Po (HK);
Thomas O. Nagel, Rockford, IL (US)

(73) Assignee: Fasteners for Retail, Inc., Twinsburg, OH (US)

( * ) Notice: Subject to any disclaimer, the term of this patent is extended or adjusted under 35 U.S.C. 154(b) by 0 days.

(21) Appl. No.: 16/295,056

(22) Filed: Mar. 7, 2019

(65) Prior Publication Data
US 2019/0290020 A1 Sep. 26, 2019

Related U.S. Application Data

(60) Provisional application No. 62/646,115, filed on Mar. 21, 2018.

(51) Int. Cl.
*A47F 1/12* (2006.01)
*H01R 12/55* (2011.01)
(Continued)

(52) U.S. Cl.
CPC ............. *A47F 1/126* (2013.01); *A47F 1/125* (2013.01); *A47F 3/002* (2013.01); *A47F 5/0861* (2013.01);
(Continued)

(58) Field of Classification Search
CPC .......... A47F 1/125; A47F 1/126; A47F 3/002; A47F 5/0861; A47F 2010/025;
(Continued)

(56) References Cited

U.S. PATENT DOCUMENTS

| 4,383,242 A | 5/1983 | Sassover et al. |
| 4,718,626 A | 1/1988 | Thalenfeld et al. |

(Continued)

FOREIGN PATENT DOCUMENTS

| EP | 2 888 723 | 7/2015 |
| EP | 2 988 281 | 2/2016 |

(Continued)

OTHER PUBLICATIONS

U.S. Appl. No. 13/312,644, filed Dec. 6, 2011, Valiulis et al.
(Continued)

*Primary Examiner* — Patrick D Hawn
(74) *Attorney, Agent, or Firm* — Reinhart Boerner Van Deuren P.C.

(57) ABSTRACT

A retail merchandise pusher with a remote alarm feature is provided. The pusher includes a housing and an adaptor. The adaptor is removably coupled to the housing and slidably coupled to a track. The pusher including a shaft rotatable about its axis in a first and second direction and a gear wheel coupled to the shaft. The rotation of the gear wheel causing a first electrical contact to engage with a second electrical contact, such that the distance that the pusher moves along the track can be measured by totaling the number of times the first electrical contact engages with the second electrical contact.

14 Claims, 8 Drawing Sheets

(51) Int. Cl.
*H05K 1/18* (2006.01)
*H05K 7/14* (2006.01)
*A47F 5/08* (2006.01)
*A47F 3/00* (2006.01)
*G08B 13/22* (2006.01)
*A47F 10/02* (2006.01)

(52) U.S. Cl.
CPC .............. *H01R 12/55* (2013.01); *H05K 1/181* (2013.01); *H05K 7/1422* (2013.01); *A47F 2010/025* (2013.01); *G08B 13/22* (2013.01); *H05K 2201/10098* (2013.01)

(58) Field of Classification Search
CPC ...... H01R 12/55; H05K 1/181; H05K 7/1422; H05K 2201/10098; G08B 13/22
See application file for complete search history.

(56) References Cited

U.S. PATENT DOCUMENTS

| | | |
|---|---|---|
| 5,068,643 A | 11/1991 | Yashina |
| 5,168,263 A | 12/1992 | Drucker |
| 5,317,304 A | 5/1994 | Choi |
| 5,434,559 A | 7/1995 | Smiley et al. |
| 5,570,080 A | 10/1996 | Inoue et al. |
| 5,757,270 A | 5/1998 | Mori |
| 5,838,225 A | 11/1998 | Todd |
| 5,955,951 A | 9/1999 | Wischerop et al. |
| 5,979,674 A | 11/1999 | Thalenfeld |
| 5,995,003 A | 11/1999 | Rogers |
| 6,049,268 A | 4/2000 | Flick |
| 6,133,830 A | 10/2000 | D'Angelo et al. |
| 6,279,256 B1 | 8/2001 | Norolof et al. |
| 6,373,381 B2 | 4/2002 | Wu |
| 6,517,000 B1 | 2/2003 | McAllister |
| 6,539,280 B1* | 3/2003 | Valiulis ............... G06Q 10/087 221/217 |
| 6,690,411 B2 | 2/2004 | Naidoo et al. |
| 6,967,578 B1 | 11/2005 | Guida |
| 7,059,518 B2 | 6/2006 | Forster |
| 7,202,784 B1 | 4/2007 | Herwig |
| 7,347,335 B2* | 3/2008 | Rankin, VI ............ A47F 1/126 211/59.3 |
| 7,530,188 B2 | 5/2009 | Beilenhoff et al. |
| 7,584,930 B2 | 9/2009 | Zich |
| 7,591,422 B2 | 9/2009 | Maitin |
| 7,671,741 B2 | 3/2010 | Lax et al. |
| 7,749,121 B2* | 7/2010 | Perng ................... B62M 6/55 475/5 |
| 7,768,399 B2 | 8/2010 | Hachmann et al. |
| 7,792,711 B2 | 9/2010 | Swafford, Jr. et al. |
| 7,969,305 B2 | 6/2011 | Belden, Jr. et al. |
| 8,274,391 B2 | 9/2012 | Yang |
| 8,378,826 B2 | 2/2013 | Mercier et al. |
| 8,386,075 B2* | 2/2013 | Lockwood ............ G07F 17/14 700/236 |
| 8,443,988 B2* | 5/2013 | Niederhuefner ........ A47F 1/125 211/59.3 |
| 8,534,469 B2 | 9/2013 | Northrup, Jr. et al. |
| 8,629,772 B2 | 1/2014 | Valiulis et al. |
| 8,720,702 B2 | 5/2014 | Nagel |
| 8,803,687 B2 | 8/2014 | Valiulis et al. |
| 8,812,378 B2* | 8/2014 | Swafford, Jr. ........ G07F 11/42 705/28 |
| 8,823,521 B2* | 9/2014 | Overhultz ............. A47F 1/126 340/540 |
| 8,884,761 B2 | 11/2014 | Valiulis |
| 9,241,583 B2 | 1/2016 | Nagel |
| 9,254,049 B2 | 2/2016 | Nagel |
| 9,318,007 B2 | 4/2016 | Valiulis et al. |
| 9,318,008 B2 | 4/2016 | Valiulis et al. |
| 9,324,220 B2 | 4/2016 | Valiulis |
| 9,483,896 B2* | 11/2016 | Lockwood ............ G07F 17/10 |
| 9,495,856 B2 | 11/2016 | Brenner |
| 9,576,417 B2 | 2/2017 | Christianson |
| 9,805,334 B2 | 10/2017 | Overhultz et al. |
| 9,805,539 B2* | 10/2017 | Swafford, Jr. ........ G07F 11/36 |
| 10,121,341 B2 | 11/2018 | Ewing et al. |
| 10,271,666 B2* | 4/2019 | Taylor ................. G07G 1/0036 |
| 10,357,118 B2* | 7/2019 | Swafford ............. A47F 5/0068 |
| 10,535,216 B2* | 1/2020 | Swafford, Jr. ........ G07F 11/42 |
| 2001/0004239 A1 | 6/2001 | Irizarry |
| 2002/0067259 A1 | 6/2002 | Fufidio et al. |
| 2002/0130776 A1 | 9/2002 | Houde |
| 2003/0030548 A1 | 2/2003 | Kovacs et al. |
| 2003/0175004 A1 | 9/2003 | Garito et al. |
| 2003/0227382 A1 | 12/2003 | Breed |
| 2004/0145477 A1 | 7/2004 | Easter et al. |
| 2004/0195319 A1 | 10/2004 | Forster |
| 2005/0104733 A1 | 5/2005 | Campero |
| 2005/0161420 A1 | 7/2005 | Hardy et al. |
| 2005/0168345 A1* | 8/2005 | Swafford, Jr. ......... A47F 1/126 340/686.1 |
| 2005/0279722 A1* | 12/2005 | Ali ....................... A47F 10/00 211/59.3 |
| 2006/0163272 A1* | 7/2006 | Gamble ................. A47F 1/126 221/227 |
| 2006/0198611 A1 | 9/2006 | Park |
| 2008/0307687 A1 | 12/2008 | Nagel et al. |
| 2008/0309489 A1 | 12/2008 | Hachmann et al. |
| 2009/0091448 A1 | 4/2009 | Leyden et al. |
| 2009/0095695 A1 | 4/2009 | Moock et al. |
| 2009/0109027 A1 | 4/2009 | Schuller |
| 2010/0013603 A1 | 1/2010 | Chatani et al. |
| 2010/0097223 A1 | 4/2010 | Kruest et al. |
| 2010/0175438 A1 | 7/2010 | Sankey |
| 2010/0238031 A1 | 9/2010 | Belden, Jr. et al. |
| 2011/0215060 A1 | 9/2011 | Niederhuefner |
| 2011/0227735 A1 | 9/2011 | Fawcett et al. |
| 2011/0284571 A1* | 11/2011 | Lockwood ............ G07G 3/003 221/151 |
| 2012/0293330 A1 | 11/2012 | Grant et al. |
| 2013/0106259 A1* | 5/2013 | Lockwood ............ G07F 9/026 312/35 |
| 2013/0141240 A1 | 6/2013 | Valiulis et al. |
| 2013/0142494 A1 | 6/2013 | Valiulis et al. |
| 2014/0055264 A1 | 2/2014 | Valiulis et al. |
| 2014/0055266 A1 | 2/2014 | Valiulis |
| 2014/0070948 A1 | 3/2014 | Valiulis et al. |
| 2014/0197953 A1 | 7/2014 | Valiulis et al. |
| 2014/0352372 A1 | 12/2014 | Grant et al. |
| 2015/0321827 A1* | 11/2015 | Lockwood ............ A47F 1/126 221/265 |
| 2015/0371482 A1 | 12/2015 | Szpak et al. |
| 2017/0202369 A1 | 7/2017 | Mercier et al. |
| 2018/0047243 A1 | 2/2018 | Swafford, Jr. et al. |
| 2019/0374048 A1* | 12/2019 | Valiulis ................. A47F 10/00 |

FOREIGN PATENT DOCUMENTS

| | | |
|---|---|---|
| KR | 10-0823026 B1 | 4/2008 |
| KR | 20100137956 A | 12/2010 |
| KR | 2020110002261 U | 3/2011 |
| KR | 20110043837 A | 4/2011 |
| KR | 20110080411 A | 7/2011 |
| WO | WO 97/40724 A1 | 11/1997 |
| WO | WO 99/27824 A1 | 6/1999 |
| WO | WO 01/81988 A2 | 11/2001 |
| WO | WO 2011/025085 A1 | 3/2011 |
| WO | WO 2012/127849 A1 | 9/2012 |
| WO | WO 2018/045038 | 3/2018 |

OTHER PUBLICATIONS

U.S. Appl. No. 15/627,033, filed Jun. 19, 2017, Ewing et al.
U.S. Appl. No. 16/113,796, filed Aug. 27, 2018, Ewing et al.
U.S. Appl. No. 16/295,063, filed Mar. 7, 2019, Ewing et al.
Indyme smartresponse; 2 pages printed from internet http://www.indyme.com/; date last visited Apr. 8, 2013.

* cited by examiner

ANTI-THEFT RETAIL MERCHANDISE PUSHER WITH REMOTE ALARM FEATURE

CROSS-REFERENCE TO RELATED PATENT APPLICATION

This patent application claims the benefit of U.S. Provisional Patent Application No. 62,646,115, filed Mar. 21, 2018, the entire teachings and disclosure of which are incorporated herein by reference thereto.

FIELD OF THE INVENTION

This invention generally relates to a retail merchandise pusher, and more particularly to a self-facing retail merchandise pusher with a remote alarm feature.

BACKGROUND OF THE INVENTION

Self-facing retail merchandise displays are generally known in the art. Once such display is the pusher system. A conventional pusher system incorporates one or more pusher paddles or pusher bodies that ride along a respective elongated track. A spring is connected between the pusher body and a leading edge of the track. The spring acts to bias the pusher body forward along the track towards the leading edge thereof.

A user can retract the pusher body away from the leading edge of the track and position items of retail merchandise in a linear row on top of the track and between the leading edge of the track and the pusher body. The biasing force provided by the spring and exerted upon the pusher body serves to bias the linear row of retail merchandise forward to ultimately "front face" the merchandise.

That is, when a customer removes the leading most item of merchandise from the linear row of merchandise, the pusher body will be drawn forward by the spring to index the row of merchandise forward so that the next item of merchandise in the row is positioned proximate the leading edge of the track in an aesthetically pleasing manner Such automatic front facing eliminates the necessity for retail store employees to manually face the merchandise, and thus ultimately reduces the cost of labor of the retailer.

The aforementioned pusher systems have been utilized in various retail display environments. One example is a retail shelf. Typically, a plurality of pusher bodies and their corresponding tracks are arranged in a side by side manner along the shelf. Each pusher body and its corresponding track are separated by dividers to maintain a plurality of generally straight rows of merchandise that run from the front to the back of the shelf. Such a familiar configuration can be found in many retail stores for selling hygiene items such as deodorant, as one example.

In another configuration, the pusher system may be embodied as a stand-alone pusher tray. These trays may include means for mounting the tray as a cantilevered extension from another structure, such as a bar. These trays may also be situated directly on a retail shelf. Further, these trays may include side barriers which are adjustable so as to accommodate merchandise of differing widths. Examples of these trays may be readily seen at U.S. Pat. Nos. 9,254,049, 9,241,583, 8,720,702, each of which is incorporated by reference herein in its entirety.

Further, loss prevention is a continuing problem in the retail industry. Current anti-theft systems involve locking up merchandise behind counters that are far away from other related merchandise, or locking up the merchandise in secure cabinets that are closer to where the related merchandise is generally stored.

There are disadvantages to each of these methods. When merchandise is stored in a secured location away from the point of storage of related items, sales of the secured merchandise decrease because customers are less likely to go out of their way to locate a sales associate to retrieve the merchandise. Also, sales of related items that would otherwise be situated in proximity to the secured merchandise decrease as well because the customer is not drawn to their location.

Therefore, although common anti-theft systems may be effective at preventing loss, they often times do so at the cost of reducing sales. For those customers who are not deterred by these systems, they also have the effect of occupying more of the sales associate's time than required for other merchandise not similarly protected.

In addition, anti-theft systems that are currently known for retail displays are often times plagued by false alarms. For example, many retail displays with anti-theft systems will trigger their alarms as a sales associate is simply refilling the retail display with merchandise. Other retail displays with anti-theft systems will intentionally sound an alarm every time a customer removes a piece of merchandise from the retail display even if the customer is only removing a single piece of merchandise and has the full intention to pay for the merchandise. Indeed, many anti-theft systems currently known for retail displays have so many false alarms that employees eventually begin to assume that all alarms are false alarms, thereby, rendering the anti-theft system useless.

Accordingly, there exists a need in the art for a retail merchandise pusher incorporating an anti-theft system for retail stores that will deter theft without discouraging the sale of the merchandise and related items. Additionally, the retail merchandise pusher and incorporated anti-theft system should be able to be retrofitted onto existing retail displays to keep the cost of installation and the shelving downtime required for installation as low as possible. Additionally, the retail merchandise pusher and incorporated anti-theft system should include measures to limit the number of false alarms sounded by the anti-theft system.

The invention relates to improvements in the above described pusher systems, more particularly, the above described pusher trays. These and other advantages of the invention, as well as additional inventive features, will be apparent from the description of the invention provided herein.

BRIEF SUMMARY OF THE INVENTION

In one aspect, the invention provides a retail merchandise pusher. The retail merchandise pusher including housing and an adaptor. The pusher further includes a shaft rotatable in a first direction and a second direction about its axis and a gear wheel coupled to the shaft, such that the gear wheel is rotatable about the shaft in the second direction. The pusher also including a first electrical contact and a second electrical contact. The movement of the pusher along the track rotates the gear wheel, such that the gear wheel causes the first electrical contact to engage with the second electrical contact and that a distance that the pusher has moved along the track can be measured by the total engagements between the first electrical contact and the second electrical contact.

In embodiments according to this aspect, the retail merchandise pusher further comprises an adaptor that is removably coupleable with the housing.

In embodiments according to this aspect, the adaptor is slidably coupled with a track of a retail display.

In embodiments according to this aspect, the gear wheel is coupled to the shaft by a unilateral bearing.

In embodiments according to this aspect, the unilateral bearing has an inner bearing directly coupled to the shaft and the inner bearing is only rotatable about the axis in the second direction.

In embodiments according to this aspect, engagement between the first electrical contact and the second electrical contact closes a circuit formed between the first electrical contact and the second electrical contact.

In embodiments according to this aspect, the first electrical contact and the second electrical contact are electrically coupled to a circuit board.

In embodiments according to this aspect, the circuit board is electrically coupled to an antenna capable of emitting a wireless signal from the pusher.

In embodiments according to this aspect, the retail merchandise pusher further comprises a biasing member that biases the pusher along the second direction of the track.

In embodiments according to this aspect, the retail merchandise pusher further comprises a second biasing member electrically coupled to a circuit board. The second biasing member capable of receiving electrical signals from the circuit board and acts as an antenna for emitting a wireless signal to at least one of a central receiver, an alarm box, or an output receiving device.

In embodiments according to this aspect, the gear wheel does not rotate in the second direction about the axis as the pusher moves along the first direction of the track.

In another aspect, the invention provides a retail merchandise pusher system. The retail merchandise pusher system including a track and a pusher. The pusher having housing and an adaptor that is slidable along the track in a first direction and a second direction. The pusher comprising a first electrical contact and a second electrical contact where the movement of the pusher along the track causes the first electrical contact to engage with the second electrical contact, such that the distance that the pusher has moved along the track can be determined by the total number of engagements formed by the first electrical contact and the second electrical contact.

In embodiments according to this aspect, the first electrical contact and the second electrical contact are electrically coupled to a circuit board that is programmed to detect each time that an engagement is formed between the first electrical contact and the second electrical contact.

In embodiments according to this aspect, the circuit board is electrically coupled to an antenna that can emit a wireless signal to a central receiver, an alarm box, or another output receiving device.

In embodiments according to this aspect, the adaptor is removably coupleable with the pusher.

In embodiments according to this aspect, the adaptor is removably coupleable with the track.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
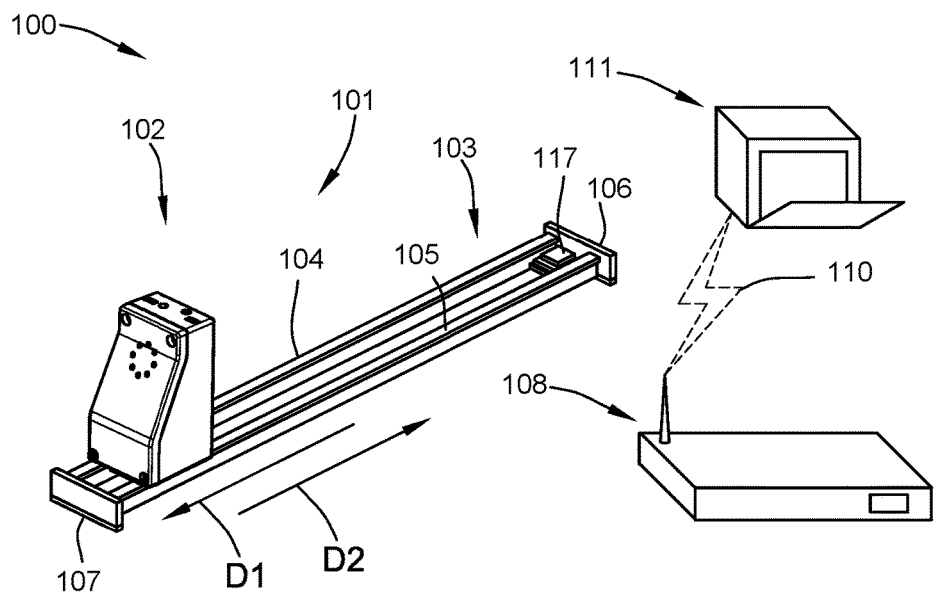
FIG. 1 is a perspective view of a pusher and a remote alarm system arranged as components in a theft deterrent system, according to one embodiment of the present application.
Figure 1:
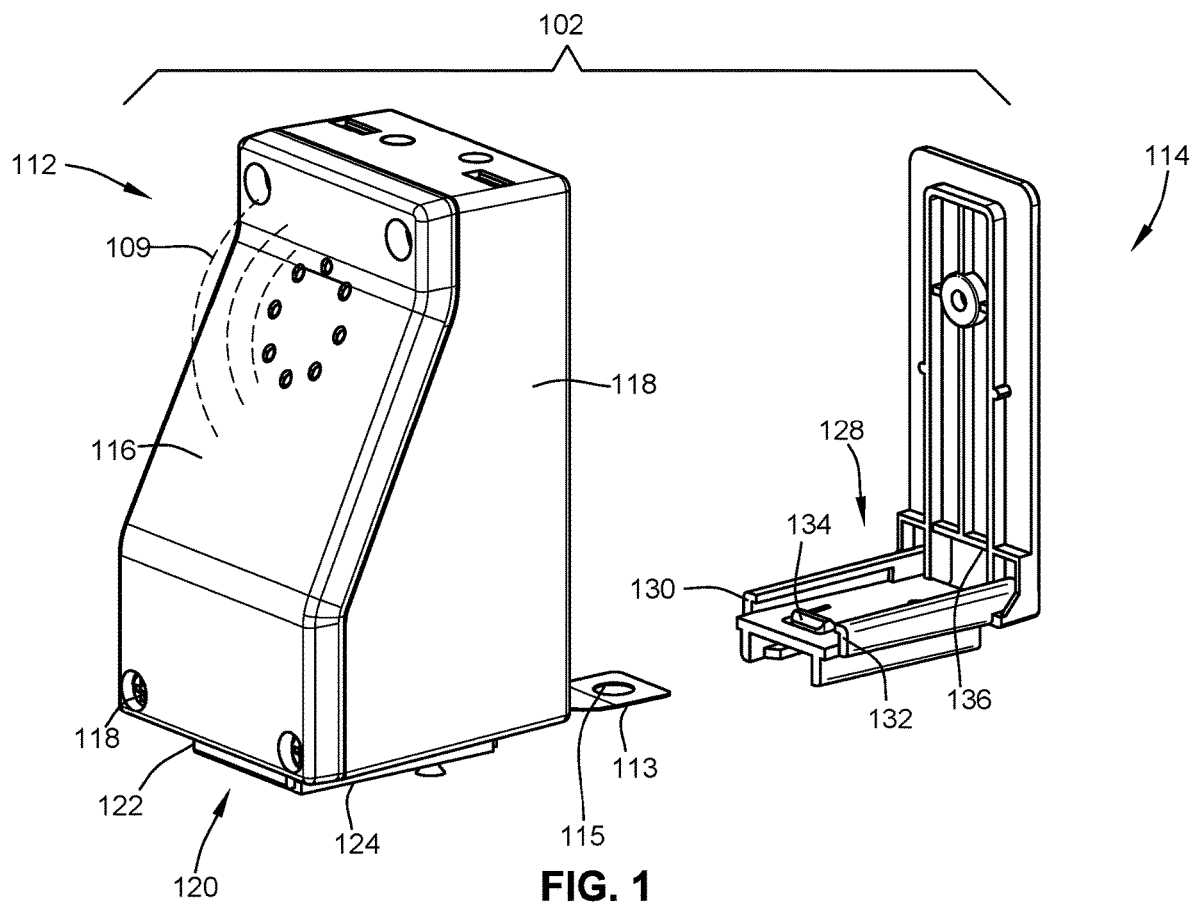

Turning to FIG. 1, the pusher and remote alarm system 100 includes a retail merchandise display 101 comprising a retail merchandise pusher 102 and an elongated track 103. The pusher 102 is coupled with the first rail 104 and a second rail 105 of the track 103, such that the pusher 102 can be slide in a first direction D1 from a front end 106 to a rear end 107 of the track and a second direction D2 from the rear end 107 to the front end 106 of the track 103.

The pusher and remote alarm system 100 also includes a central receiver 108 that can receive wireless signals 109 emitted from the pusher 102. The wireless receiver 108 can then send a wireless signal 110 to an alarm box 111.

In an alternative embodiment, the wireless receiver 108 and/or the alarm box 111 may have terminals for connecting the wireless receiver 108 and/or the alarm box 111 to an output receiving device, such as a computer, a pager, a cellular telephone, a public address system, computer memory, a video camera, and a video monitor.

In another embodiment, the pusher and remote alarm system 100, may omit the wireless receiver 108 and the pusher 102 can be configured to send its wireless signal 109 directly to the alarm box 111 and/or an output receiving device.

In still yet another embodiment, the central receiver 108 and the alarm box 111 may be combined in a single unit, such that the single unit can perform all of the functions of the individual central receiver 108 and the individual alarm box 111.

The pusher 102, the wireless receiver 108, the arm box 111, and any output receiving device of a system 100 can be configured to emit and receive a multitude of different wireless signals over a multitude of different frequencies.

For example, in one embodiment, the pusher 102 may be configured to emit a first wireless signal 109 along a first frequency that only the wireless receivers 108 of the system 100 are configured to receive and to emit a second wireless signal 109 over a second frequency that only the alarm boxes 111 of the system 100 are configured to receive and vice versa.

The pusher 102 of the system 100 may also be configured to emit a third wireless signal 109 along a third frequency that only half of the wireless receivers 108 of the system 100 are configured to receive and to emit a fourth wireless signal 109 over a fourth frequency that the other half of the wireless receivers 108 are configured to receive and vice versa.

The pusher 102 may also be configured to emit a fifth wireless signal 109 that when received by an alarm box 111 of the system 100 causes the alarm box 111 to emit a first tone and to emit a sixth wireless signal 109 that when received by the alarm box 111 causes the alarm box 111 to emit a second tone that is different from the first tone.

As will also be understood, the pusher and remote alarm system 100 may include any number of pushers 102, wireless receivers 108, alarm boxes 111, and/or out output receiving devices desired by the user.

The pusher and remote alarm system 100 can also be configured such that any pusher 102, wireless receiver 108, alarm box 111, and/or other output receiving devices in the system 100 can be configured to communicate with any other pusher 102, wireless receiver 108, alarm box 111, and/or other output receiving device connected to the system 100.

As will be understood, by including the system 100 to be configured to include any number and combination of pushers 102, the wireless receivers 108, the arm boxes 111, and output receiving devices, and having them capable of communicating with each other by being configured to emit and receive signals over a multitude of different frequencies provides a means to customize each specific system 100 according to each specific user's needs. As used herein, "wireless signal" means any type of wireless signals which broadly speaking may be AM signals, FM signals, microwave signals, combinations thereof, or any other suitable type of wireless signal, using any known communication protocol, e.g. wifi, Bluetooth, cellular, conventional radio, etc. This same definition of a wireless signal applies to any signals described explicitly, inherently, or implicitly as being sent wirelessly.

The pusher 102 includes a housing 112 and an adaptor 114. The housing 112 has a top cover 116 and a bottom cover 118 that are held together with coupling members 118. The pusher 102 houses a biasing member 113 that extends through the bottom cover 118 of the housing 112. The biasing member 113 has a coupling aperture 115 that can be coupled to any coupling means 117 provided at the front end 106 of the track 103.

As the pusher 102 is shifted from the front end 106 of the track 103 to the rear end 107 of the track 103 along the first direction D1 the biasing member 113 extends, which causes a second biasing member 119 coupled to the biasing member 113 to contract. The contraction of the second biasing member 119 stores the energy of the extended biasing member 113, which biases the pusher 102 against any retail merchandise that has been loaded between the pusher 102 and the front end 106 of the track 103.

Then, as a piece of retail merchandise is removed from the track 103 the energy stored in the second biasing member 119 causes the biasing member 113 to contract to fill the void left by the piece of retail merchandise removed by the customer. When the biasing member 113 contracts it causes the pusher 102 to shift in the second direction D2 towards the front end 106 of the track 103, which causes any retail merchandise remaining in the track 103 to also shift or front-face in the second direction D2 towards the front end 106 of the track 103.

Figure 2:
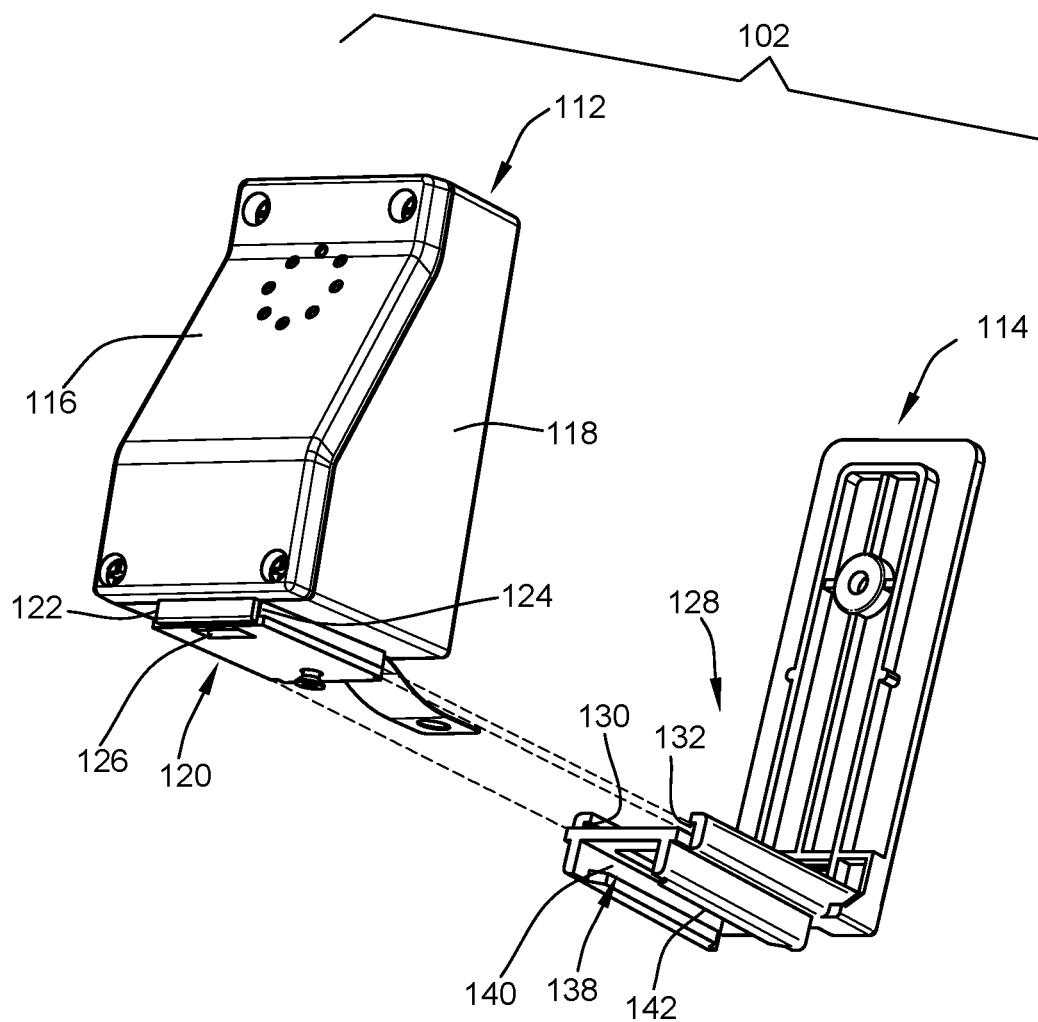
FIG. 2 is a detailed view of the pusher and track illustrated in FIG. 1.
Figure 2:
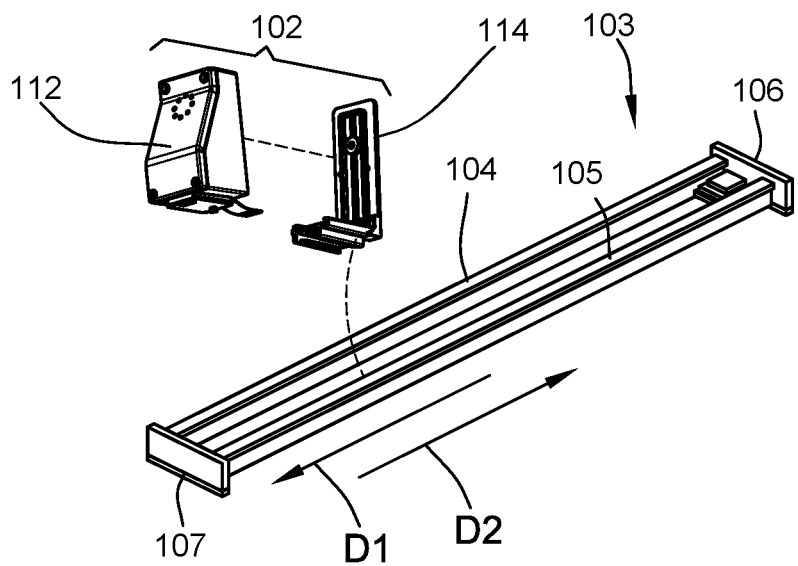

Turning to FIG. 2, the bottom cover 118 of the housing 112 includes a coupling region 120 that extends from the bottom cover 118 of the housing 112. The coupling region includes a first rail 122, a second rail 124, and a recessed portion 126. The adaptor 114 includes a coupling portion 128 that corresponds to the coupling region 120 of the housing 112 and includes a first flange 130, a second flange 132, and a retractable clip 134.

As will be understood, the adaptor 114 can be removably coupled to the housing 112 by inserting the biasing member 113 through the opening 136 provided in the adaptor 113 and then sliding the first and second flange 130, 132 of the adaptor 114 along the first and second rail 122, 124 of the housing 112 until the retractable clip 134 of the adaptor 114 engages with the recessed portion 126 of the housing 112. This will secure the adaptor 114 to the housing 112 until enough force is applied to the adaptor 114 to cause the retraction of the retractable clip 134 as the first and second flanges 130, 132 of the adaptor 113 are simultaneously slide out from the first and second rail 122, 124 of the housing 112.

The adaptor 114 also includes a track coupling section 138 comprising a first flange 140 that slidably engages with the first rail 104 of the track and a second flange 142 that slidably engages with the second rail 105 of a track 103. As will be understood, the slidably engagement between the first and second flange 140, 142 of the adaptor 114 and the first and second rail 104, 105 of the track 103 slidably engages the pusher 102 to the track 103, such that the pusher 102 can shift in both the first direction D1 and the second direction D2 along the track 103.

Therefore, employing an adaptor 114 as an intermediary between the housing 112 and the track 103 provides the advantage of being able to use a single housing 112 in a variety of different retail displays 101 that have different track 103 configurations.

In another embodiment, the housing 112 of the pusher 102 will include a coupling means that is integrally formed on the housing 112 of the pusher 102. The coupling means will be slidably coupleable to the track 103 of a retail merchandise display 101, such that the housing 112 of the pusher 102 is directly coupled to the track 103 of the retail merchandise display 101. As will be understood, according to this embodiment, the housing 112 of the pusher 102 will be slidably coupled directly to the track 103, such that the pusher 102 can move in the first direction D1 and the second direction D2 along the track 103 of the retail merchandise display 101 without employing an adaptor 114.

Figure 3:
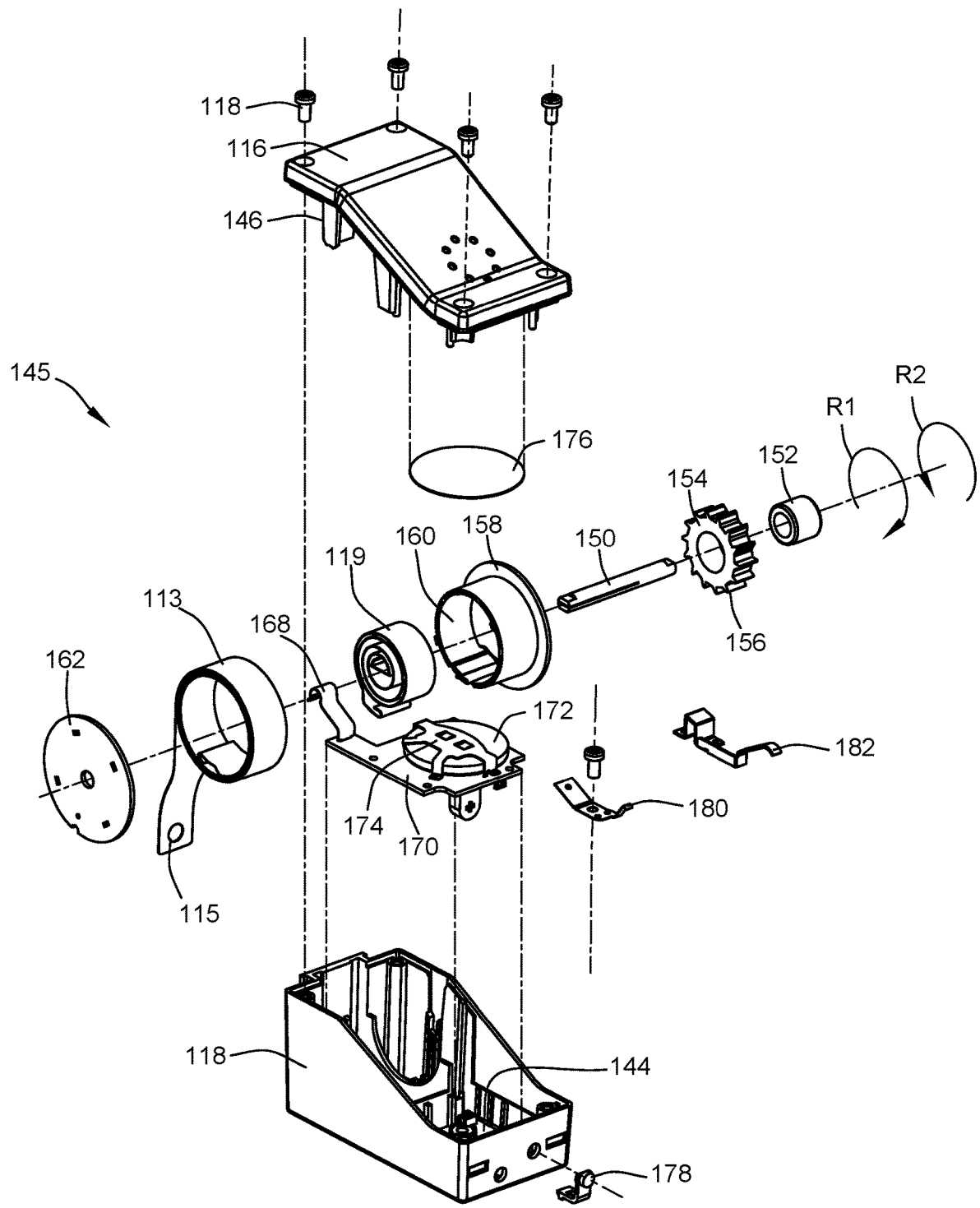
FIG. 3 is an exploded view of the housing of the pusher illustrated in FIG. 2.
Figure 4:
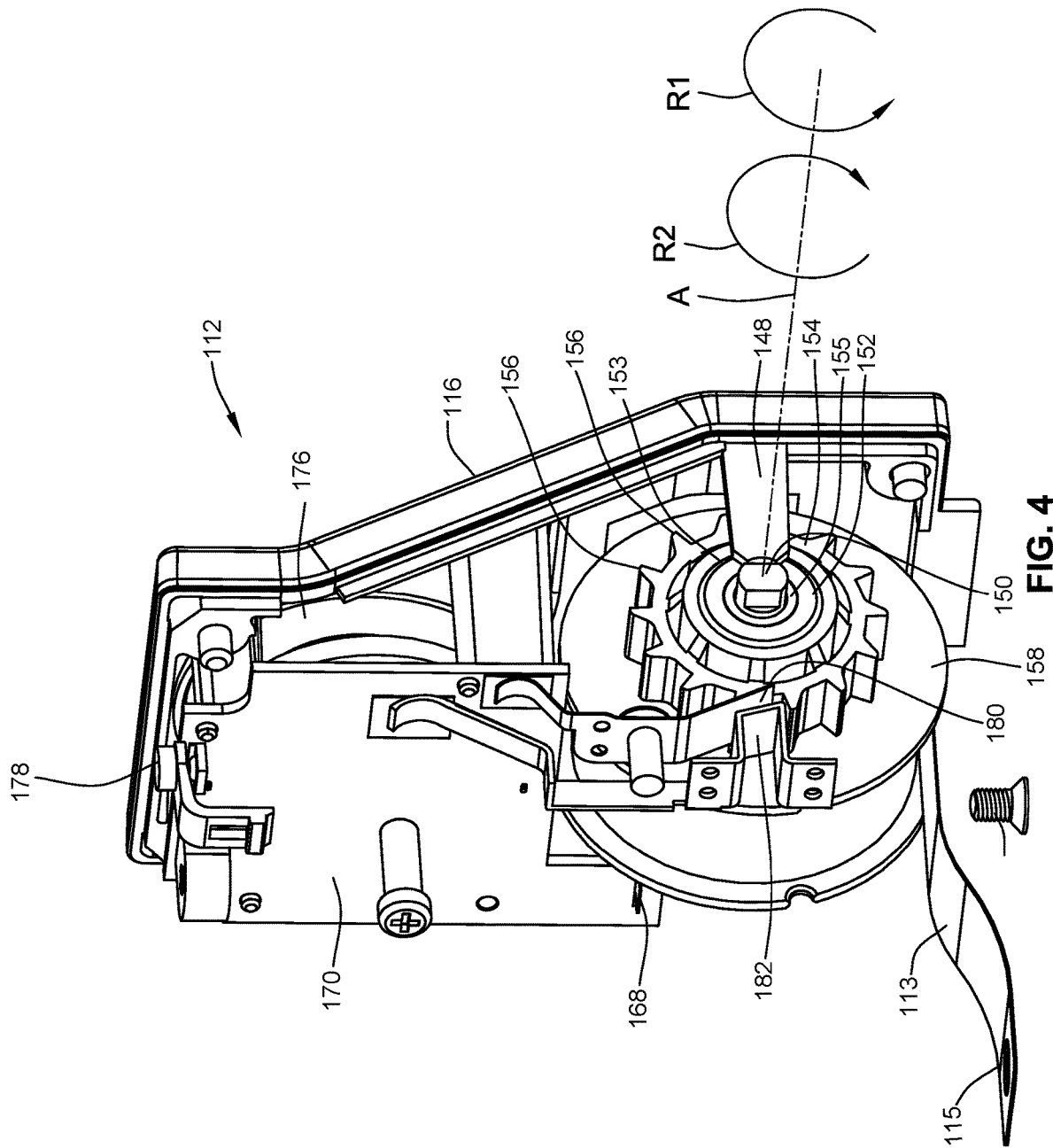
FIG. 4 is a perspective rear-side view of the housing illustrated in FIG. 3 with the bottom cover of the housing removed.
Figure 5:
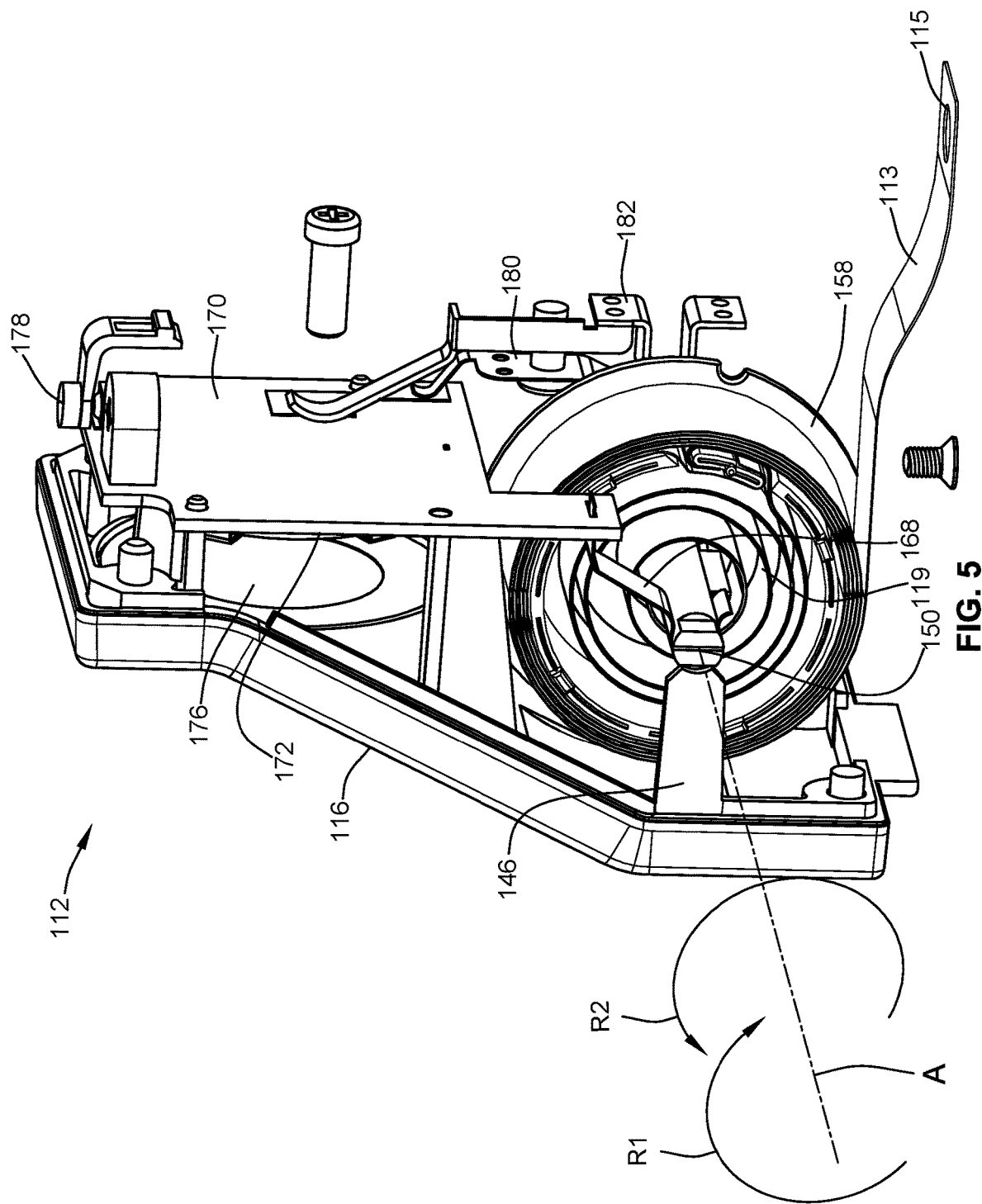
FIG. 5 is a perspective rear-side view of the housing showing the opposing side of the housing illustrated in FIG. 4.

Turning to FIG. 3, illustrating an exploded view of the housing 112. As illustrated, the top cover 116 and bottom cover 118 of the housing 112 provide an internal cavity 144 that houses the internal components 145 within the housing 112. The top cover 116 of the housing 112 also provides a first arm 146 (see FIG. 5) and a second arm 148 (see FIG. 4) that rotatably support a shaft 150 within the internal cavity 144 of the housing 112. As illustrated in FIGS. 4 and 5, the first and second arm 146, 148 rotatably support the shaft 150, such that the shaft 150 can rotate in both a first direction R1 and a second direction R2 about axis A.

With reference to FIGS. 4 and 5, the shaft 150 extends through and supports a unilateral bearing 152 that has an outer surface 153 surrounding an inner bearing 155. The outer surface 152 supports a gear wheel 154 that has a plurality of gear teeth 156. The inner bearing 155 is coupled directly to the shaft 150 and is designed to rotate only in the second direction R2 about axis A.

The shaft 150 is also coupled to a driving wheel 158 having a first cover 160 and a second cover 162. The biasing member 113 is wound about the driving wheel 158 and the second biasing member 119 housed within the driving wheel 158.

The driving wheel 158 also houses the second biasing member 119. As discussed above, as the track 103 is loaded with retail merchandise the pusher 102 is shifted in a first direction D1 along the track 103, which causes the biasing member 113 to extend along the track 103. As the biasing member 113 extends the second biasing member 119 contracts in order to store the energy released from the extension of the biasing member 113. This energy of the second biasing member 119 is then used to bias the pusher 102 against the retail merchandise in the track and to contract the biasing member 102 as retail merchandise is removed from the track 103.

In addition to storing the energy of the extended biasing member 113, the second biasing member 119 is also electrically coupled to a third electrical contact 168 is also electrically coupled to the circuit board 170. The third electrical contact 168 provides a means for the circuit board 170 to send electrical signals to the second biasing member 119 so that the second biasing member 119 can also act as an antenna to broadcast any signals that are transmitted from the pusher 102, such as the wireless signals 109 transmitted from the pusher 102 to the other devices in the pusher and remote alarm system 100, such as the central receiver 108 and/or the alarm box 111 (see FIG. 1).

The circuit board 170 is coupled to and provided power by a battery 172 that is secured to the circuit board 170 by a fixed plate 174. The battery 172 provides all of the power required by the pusher 102 internally, such that an outside power source is not required. However, in an alternative embodiment, it is envisioned that an outside power source could be used to provide the electrical power required to operate the pusher 102.

The circuit board 170 is also electrically coupled to a speaker or buzzer 176 and a light guide 178. As will be discussed later, the circuit board 170 can be programmed to send electrical signals to the speaker or buzzer 176 to beep or sound an alarm if certain criteria, such as the movement of the pusher 102 along the track 102, are detected by the circuit board 170. Likewise, the circuit board 170 can also be programmed to illuminate the light guide 178 if certain parameters are detected by the circuit board 170, such as detecting low power from the battery 172.

A first electrical contact 180 and a second electrical contact 182 are also electrically coupled to the circuit board 170. When the first electrical contact 180 and the second electrical contact 182 make contact with one another they form a closed circuit. As will be discussed in detail below, the number of times that the circuit formed between the first and second electrical contact 180, 182 can be used by the circuit board 170 to determine the distance that the pusher 102 has shifted in the second direction D2 along the track 103 because of the removal of a piece or pieces of retail merchandise from the track 103.

Similarly, if the dimensions of the pieces of retail merchandise loaded in the track are known, then distance traveled by the pusher 102 in the second direction D2 that is based on the number of times the circuit formed between the first and second electrical contact 180, 182 is closed and opened can also be used to determine the number of pieces of retail merchandise that have been removed from the track 103.

Next, the operation of the pusher 102 will be discussed. When the retail merchandise display 101 is being loaded with retail merchandise the pusher 102 is shifted in a first direction D1 away from the front end 106 of the track 103. As the pusher 102 is shifted in the first direction D1 the biasing member 113 is extended or unwound from the driving wheel 158 of the pusher 102 and the second biasing member 119 is contracted to store the energy lost by the extension or unwinding of the biasing member 113.

The extension or unwinding of the biasing member 113 rotates the driving wheel 158 in the second direction R2 about axis A. The rotation of the driving wheel 158 then rotates the shaft 150, which is coupled to the driving wheel 158, in the second direction D2 about axis A.

As the shaft 150 is rotated in the second direction R2 about axis A the inner bearing 155 of the unilateral bearing 152 rotates along with the shaft 150 in the second direction R2 about axis A. The rotation of the inner bearing 155 prevents the rotational forces of the shaft 150 from being applied to the gear wheel 154 coupled to the stationary exterior surface 153 of the unilateral bearing 152.

Therefore, the gear wheel 154 of the pusher 102 remains stationary as the pusher 102 is shifted towards the rear end 107 of the track 103 in order to accommodate the loading of retail merchandise from the front end 106 of the track 103.

Once the retail merchandise has been loaded between the pusher 102 and the front end 106 of the track 103, the pusher 103 biases the retail merchandise in a second direction D2 towards the front end 106 of the track 103.

As a piece of retail merchandise is removed from the front end 106 of the track 103, a void is created at the front end 106 of the track 103. The void causes the biasing member 113 to contract and shift the pusher 102 and/or the remaining retail merchandise towards the front end 106 of the track 103.

As the biasing member 113 contracted, the driving wheel 158 is rotated in the first direction R1 about axis A. The rotation of the driving wheel 158 in the first direction R1 about axis A causes the shaft 150, which is coupled to the driving wheel 158, to also rotate in the first direction R1 about axis A.

As the shaft 150 rotates in the first direction R1 about axis A, the inner bearing 155, which is only designed to rotate in the second direction R2 about axis A, does not rotate along with the shaft 150.

Therefore, the rotational forces of the shaft 150 are applied to the unilateral bearing 152, which causes the exterior surface 153 of the unilateral bearing 152 to rotate in the first direction R1 about axis A.

As the exterior surface 152 of the unilateral bearing 152 rotates in the first direction R1 about axis A the gear wheel 154, which is coupled to the exterior surface 152 of the unilateral bearing 152, also rotates in the first direction R1 about axis A.

As the gear wheel 154 is rotated in the first direction R1 about axis A its gear teeth 156 contact and apply force to the first electrical contact 180. The force applied to the first electrical contact 180 by each gear tooth 156 shifts the first electrical contact 180 to make contact with the second electrical contact 182. This contact formed between the first electrical contact 180 and the second electrical contact 182 closes a circuit formed between the first electrical contact 180 and the second electrical contact 182 that can be detected by the circuit board 170.

As the gear wheel 154 continues its rotation in the first direction R1 about axis A, the gear tooth 156 applying the force to the first electrical contact 180 eventually disengages with the first electrical contact 180.

As the gear tooth 156 disengages with the first electrical contact 180 the force causing the first electrical contact 180 to make contact with the second electrical contact 182 is removed and the first electrical contact 180 returns to its original position where it is not in contact with the second electrical contact 182.

Thus, the circuit formed between the first electrical contact 180 and the second electrical contact 182 returns to being an open circuit until the gear wheel 154 has been sufficiently rotated in the first direction R1 about axis A, such that the next gear tooth 156 of the gear wheel 154 can make contact with the first electrical contact 180 to close the circuit between the first and second electrical contacts 180, 182.

Thus, the removal of retail merchandise from the front end 106 of the track 103 causes the retraction of the biasing member 113 that causes the rotation of the gear wheel 154 and the gear teeth 156 in the first direction R1 about axis A via the rotation of the driving wheel 158 and shaft 150 in the first direction R1 about axis A. The rotation of the gear teeth 156 in the first direction R1 about axis A causes the first electrical contact 180 to engage with the second electrical contact 182 to close an electrical circuit formed between the first electrical contact 180 and the second electrical contact 182, which can be measured by the circuit board 170.

As such, it will be understood that the pusher 102 can detect the amount of retail merchandise being removed from the front end 106 of the track 103 during any given time interval by counting the number of times that the circuit formed between the first electrical contact 180 and the second electrical contact 182 is closed.

In another embodiment, it is envisioned that the motion of the pusher 102 along the track 103 can be measured using any mechanical means generally known in the art, such as, but not limited to, a rack and pinion. The pusher 102 could then detect the amount of retail merchandise being removed from the front end 106 of the track 103 during any given time interval by counting the distance the pusher 102 has moved along the track 103 during that time interval.

In another embodiment, it is envisioned that the motion of the pusher 102 along the track 103 could be detected by any optical means generally known in the art, such as but not limited to, using a photo or video lens. The pusher 102 could then detect the amount of retail merchandise being removed from the front end 106 of the track 103 during any given time interval by counting the distance the pusher 102 has moved along the track 103 during that time interval.

In another embodiment, it is envisioned that the motion of the pusher 102 along the track 103 could be detected using any optical amplification means generally known in the art, such as but not limited to, a laser using time of flight measurements. The pusher 102 could then detect the amount of retail merchandise being removed from the front end 106 of the track 103 during any given time interval by counting the distance the pusher 102 has moved along the track 103 during that time interval.

In another embodiment, it is envisioned that the motion of the pusher 102 along the track 103 may could be detected by any ultrasonic means generally known in the art. The pusher 102 could then detect the amount of retail merchandise being removed from the front end 106 of the track 103 during any given time interval by counting the distance the pusher 102 has moved along the track 103 during that time interval.

In another embodiment, it is envisioned that the motion of the pusher 102 along the track 103 could be detected using any type of potentiometer generally known in the art. The pusher 102 could then detect the amount of retail merchandise being removed from the front end 106 of the track 103 during any given time interval by counting the distance the pusher 102 has moved along the track 103 during that time interval.

In another embodiment, it is envisioned that the motion of the pusher 102 along the track 103 could be detected using any type of accelerometer generally known in the art. The pusher 102 could then detect the amount of retail merchandise being removed from the front end 106 of the track 103 during any given time interval by counting the distance the pusher 102 has moved along the track 103 during that time interval.

In another embodiment, it is envisioned that the motion of the pusher 102 along the track 103 may be detected using any type of sonic measuring device that is generally known in the art. The pusher 102 could then detect the amount of retail merchandise being removed from the front end 106 of the track 103 during any given time interval by counting the distance the pusher 102 has moved along the track 103 during that time interval.

Turning to FIG. 5, illustrating a side perspective view of the housing 112 opposite the side illustrated in FIG. 4 showing the housing 112 with the bottom cover 118 removed to expose the internal components 145 of the housing 112.

As illustrated, the driving wheel 158 also houses an interior spring 166 of the that is electrically coupled to the circuit board 170 by a third electrical contact 168. The circuit board 170 can send electrical signals to the interior spring 166 via the third electrical contact 168 where the interior spring 166 also acts as an antenna for the pusher 102 so that the pusher 102 can send out wireless signals 109, such as the amount of retail merchandise that has been removed from its track 103 in a certain time interval, to other devices that are a part of the system, such as, but not limited to, other pushers 102, a central receiver 108 and/or an alarm box 111 (see FIG. 1).

Figure 6:
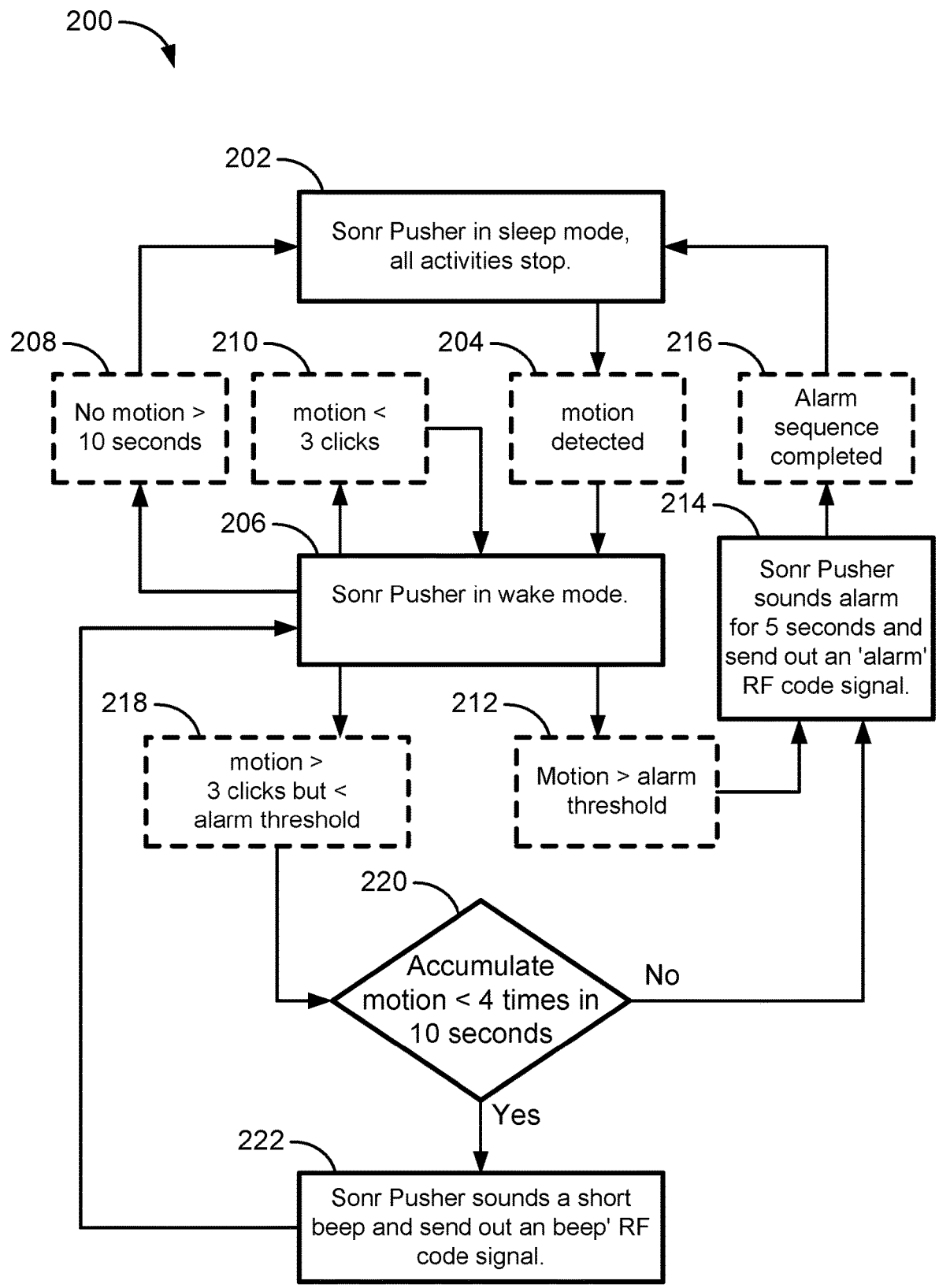
FIG. 6 is a schematic illustration of the operation of the pusher, according to one embodiment of the present application.

Turning to FIG. 6, showing a schematic illustration one embodiment of a method of using a pusher 200 according to one aspect of the present application. In the first step the pusher 102 is in sleep mode 202. In the next step motion of the pusher 102 is detected 204, such as the pusher 102 being biased towards the front end 106 of the track 103 it is installed by the removal of a piece of retail merchandise from the track 103 (see FIG. 1). After detecting motion, the next step is that the pusher 102 enters wake mode 206. After entering wake mode, the pusher 102 then the appropriate action based on the amount of motion detected by the pusher 102.

For example, if the pusher 102 detects that there has been no motion for more than 10 seconds 208 or that the pusher 102 has moved less than 3 clicks 201 the pusher 102 will return to sleep mode 202.

Next, if the pusher 102 detects that the amount of motion is greater than the alarm threshold 212 programmed into the pusher 102 the pusher will sound an alarm for 5 seconds and also send out an alarm code signal 214. Once the alarm has sounded and the alarm signal has been sent out in step 215 the alarm sequence has been completed at step 216 and the pusher 102 returns to sleep mode 202.

Finally, if the pusher 102 detects motion that is greater than 3 clicks but is less than the alarm threshold at step 218 then the pusher 102 determines if the accumulate motion is less than 4 clicks in the next 10 seconds at step 220. If the accumulate motion is not less than 4 clicks in the next 10 second at step 220 then the pusher 102 sounds the alarm for 5 seconds and sends out an alarm code signal at step 214. However, if the accumulate motion is less than 4 clicks in the next ten seconds at step 220 thane the pusher 102 will sound a short beep and send out a been code signal at step 222 before returning to wake mode at step 206 where the pusher 102 will determine the proper action depending on the amount of motion detected by the pusher 102.

Figure 7:
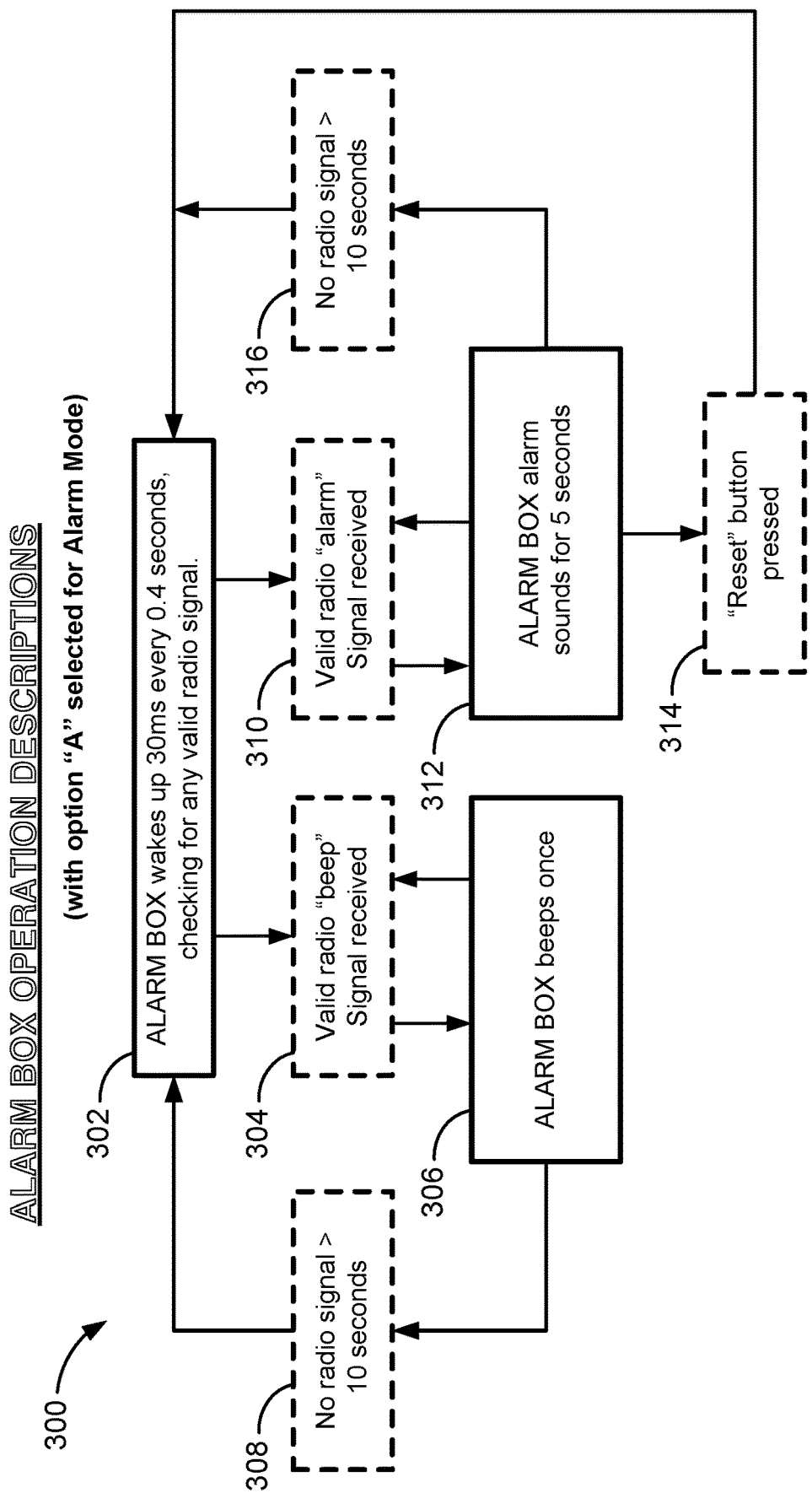
FIG. 7 is a schematic illustration of the operation of the remote alarm system according to one embodiment of the present application.

Turning to FIG. 7, showing a schematic illustration of one method of the operation of an alarm box 111 in alarm mode 300. The alarm box wakes up every 30 milliseconds to check if any valid wireless signals are being sent to the alarm box at step 302. If a valid wireless beep signal is received at step 304 then the alarm box will beep once at step 306. Then if no further wireless signal is received in 10 seconds at step 308 the alarm box returns to step 302 where it wakes every 30 milliseconds to check for any further valid wireless signals.

If a valid wireless alarm signal is received at step 310 then the alarm box sounds for 5 seconds at step 312. The alarm box will stop sounding the alarm if the reset button is pressed at step 314 and then return to step 302 where it will wake up every 30 milliseconds and check for any further valid wireless signals.

If the reset button is not pressed at step 314 the alarm box will continue to will continue to check for any valid wireless signals at step 316 until there are no further wireless signals received for more than 10 seconds at which point the alarm box will then return to step 302 where it will wake up every 30 milliseconds and check for any further valid wireless signals.

Figure 8:
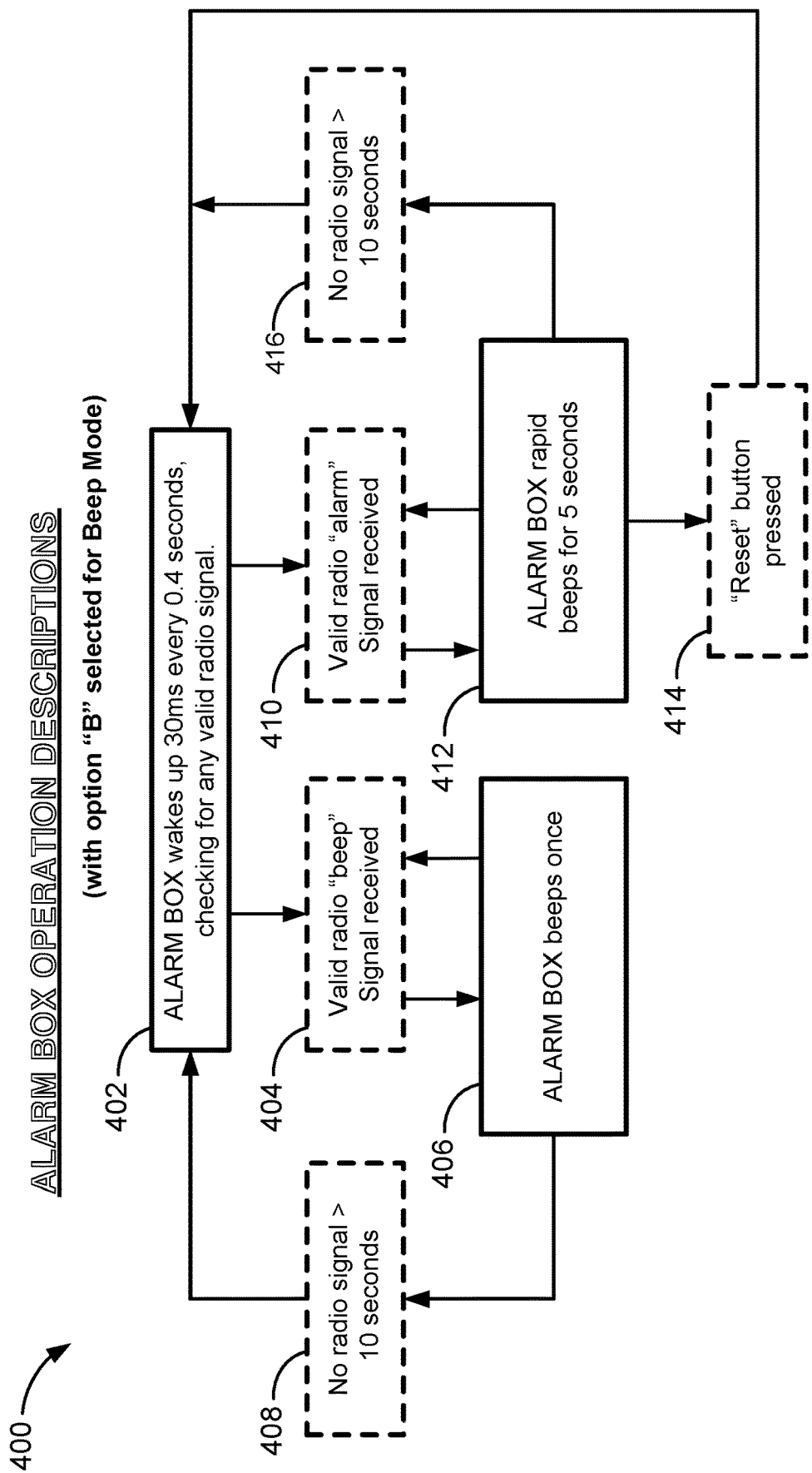
FIG. 8 is a schematic illustration of the operation of the remote alarm system according to one embodiment of the present application.

Turning to FIG. 8, showing a schematic illustration of one method of the operation of an alarm box 111 in beep mode 400. The alarm box wakes up every 30 milliseconds to check if any valid wireless signals are being sent to the alarm box at step 402. If a valid wireless beep signal is received at step 404 then the alarm box will beep once at step 406. Then if no further wireless signal is received in 10 seconds at step 408 the alarm box returns to step 402 where it wakes every 30 milliseconds to check for any further valid wireless signals.

If a valid wireless alarm signal is received at step 410 then the alarm box rapid beeps for 5 seconds at step 412. The alarm box will stop the rapid being at step 412 if the reset button is pressed at step 414 and then return to step 402 where the alarm box will wake up every 30 milliseconds and check for any further valid wireless signals.

If the reset button is not pressed at step 414 the alarm box will finish the 5 seconds of rapid beeps at step 412. Then the alarm box will continue to check for any further wireless signals until no wireless signals are received in a 10 second interval at step 416 at which point the alarm box will then return to step 402 where it will wake up every 30 milliseconds and check for any further valid wireless signals.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A retail merchandise pusher comprising:
   a housing;
   a shaft rotatable in a first rotational direction and a second rotational direction about its axis;
   a gear wheel coupled to the shaft such that the gearwheel is rotatable about the shaft in the second rotational direction;
   a first electrical contact and a second electrical contact;
   the pusher movable along the track in a first and second axial direction;
   a biasing member that biases the pusher along the track in the second axial direction;
   wherein movement of the pusher along the track rotates the gear wheel, such that the gear wheel causes the first electrical contact to engage with the second electrical contact; and
   wherein a distance that the pusher has moved along the track can be measured by the total engagements between the first electrical contact and the second electrical contact; and
   a second biasing member electrically coupled to a circuit board;
   the second biasing member capable of receiving electrical signals from the circuit board and acting as an antenna for emitting a wireless signal to at least one of a central receiver, an alarm box, or an output receiving device.

2. The retail merchandise pusher of claim 1, further comprising an adaptor that is removably coupleable with the housing.

3. The retail merchandise pusher of claim 2, wherein the adaptor is slidably coupled with a track of a retail display.

4. The retail merchandise pusher of claim 1, wherein the gearwheel is coupled to the shaft by a unilateral bearing.

5. The retail merchandise pusher of claim 4, wherein the unilateral bearing further comprises an inner bearing directly coupled to the shaft; and
wherein the inner bearing is only rotatable about the axis in the second rotational direction.

6. The retail merchandise pusher of claim 1, wherein the engagement of the first electrical contact with the second electrical contact closes a circuit formed between the first electrical contact and the second electrical contact.

7. The retail merchandise pusher of claim 6, wherein the first electrical contact and the second electrical contact are electrically coupled to a circuit board.

8. The retail merchandise pusher of claim 7, wherein the circuit hoard is electrically coupled to an antenna capable of emitting a wireless signal from the pusher.

9. The retail merchandise pusher of claim 1, wherein the gearwheel does not rotate in the second rotational direction about the axis as the pusher moves along the first axial direction of the track.

10. A retail merchandise pusher system comprising:
a track and a pusher;
the pusher having a housing and an adaptor;
the adaptor slidable along the track in a first axial direction and a axial second direction;
a biasing member that biases the pusher along the track in the second axial direction;
a shaft rotatable in a first rotational direction and a second rotational direction about its axis;
a gear wheel coupled to the shaft such that the gearwheel is rotatable about the shaft in the second rotational direction,
the pusher comprising a first electrical contact and a second electrical contact; and
wherein movement of the pusher along the track rotates the gear wheel causing the first electrical contact to engage with the second electrical contact, such that the distance that the pusher has moved along the track can be determined by the total number of engagements between the first electrical contact and the second electrical contact;
a second biasing member electrically coupled to a circuit board;
the second biasing member capable of receiving electrical signals from the circuit board and acting as an antenna for emitting a wireless signal to at least one of a central receiver, an alarm box, or an output receiving device.

11. The retail merchandise pusher system of claim 10, wherein the first electrical contact and the second electrical contact are electrically coupled to the circuit board that is programmed to detect each time that an engagement is formed between the first electrical contact and the second electrical contact.

12. The retail merchandise pusher system of claim 11, wherein the circuit board is electrically coupled to an antenna that can emit a wireless signal to a central receiver, an alarm box, or another output receiving device.

13. The retail merchandise pusher system of claim 10, wherein the adaptor is removably coupleable with the pusher.

14. The retail merchandise pusher system of claim 10, wherein the adaptor is removably coupleable with the track.

* * * * *